(12) United States Patent
Papasouliotis et al.

(10) Patent No.: US 7,176,039 B1
(45) Date of Patent: Feb. 13, 2007

(54) DYNAMIC MODIFICATION OF GAP FILL PROCESS CHARACTERISTICS

(75) Inventors: George D. Papasouliotis, Sunnyvale, CA (US); Atiye Bayman, Palo Alto, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/947,424

(22) Filed: Sep. 21, 2004

(51) Int. Cl.
*H01L 21/00* (2006.01)

(52) U.S. Cl. .................. 438/5; 438/437; 438/702; 438/763; 438/7; 438/424; 257/E21.53; 257/E21.546

(58) Field of Classification Search .............. 438/424, 438/435, 437, 702, 763, FOR. 267, 5, 7; 257/E21.53, E21.546
See application file for complete search history.

(56) References Cited

U.S. PATENT DOCUMENTS

| | | |
|---|---|---|
| 4,361,461 A | 11/1982 | Chang |
| 5,129,958 A | 7/1992 | Nagashima et al. |
| 5,227,191 A | 7/1993 | Nagashima |
| 5,246,885 A | 9/1993 | Braren et al. |
| 5,252,178 A | 10/1993 | Moslehi |
| 5,270,264 A | 12/1993 | Andideh et al. |
| 5,282,925 A | 2/1994 | Jeng et al. |
| 5,342,801 A | 8/1994 | Perry et al. |
| 5,385,857 A | 1/1995 | Solo de Zaldivar |
| 5,494,854 A | 2/1996 | Jain |
| 5,516,729 A | 5/1996 | Dawson et al. |

(Continued)

FOREIGN PATENT DOCUMENTS

JP 2003-031649 1/2003

OTHER PUBLICATIONS

Bayman et al., "Process Modulation to Prevent Structure Erosion During Gap Fill", U.S. Appl. No. 10/935,909, filed Sep. 7, 2004.

(Continued)

*Primary Examiner*—George Fourson
(74) *Attorney, Agent, or Firm*—Beyer Weaver & Thomas LLP.

(57) ABSTRACT

A method for process optimization to extend the utility of the HDP CVD gap fill technique modifies the characteristics of the HDP process (deposition and sputter components) in a dynamic mode in the course of filling a trench with dielectric material. As a result, the amount of dielectric deposited on the sidewall of the trench relative to that deposited at its bottom can be reduced and optimally minimized, thus improving the gap fill capability of the process. The dynamic modification of process characteristics provides enhanced process performance, since the optimization of these characteristics depends upon structure geometry, which is constantly changing during a gap fill operation. During the course of the gap fill operation, either at one or more discrete points or continuously, the evolution of the feature geometry is determined, either by direct measurement or in accordance with a growth model. The deposition process is modified to optimize the characteristics to the partially-filled feature geometry, and further filling the partially-filled feature using the modified deposition process is conducted. The process modification, including the geometry determination, and further filling with optimized process characteristics is optionally repeated until the gap is filled. In semiconductor manufacture, the invention relates to HDP CVD processes used to deposit IMD, ILD, or STI films for gap fill applications.

30 Claims, 5 Drawing Sheets

U.S. PATENT DOCUMENTS

| | | | |
|---|---|---|---|
| 5,532,516 | A | 7/1996 | Pasch et al. |
| 5,621,241 | A | 4/1997 | Jain |
| 5,622,894 | A | 4/1997 | Jang et al. |
| 5,636,320 | A | 6/1997 | Yu et al. |
| 5,641,545 | A | 6/1997 | Sandhu |
| 5,702,982 | A | 12/1997 | Lee et al. |
| 5,705,419 | A | 1/1998 | Perry et al. |
| 5,711,998 | A | 1/1998 | Shufflebotham |
| 5,789,818 | A | 8/1998 | Havermann |
| 5,834,068 | A | 11/1998 | Chern et al. |
| 5,851,344 | A | 12/1998 | Xu et al. |
| 5,858,876 | A | 1/1999 | Chew |
| 5,869,902 | A | 2/1999 | Lee et al. |
| 5,872,058 | A | 2/1999 | Van Cleemput et al. |
| 5,897,370 | A | 4/1999 | Joshi et al. |
| 5,910,020 | A | 6/1999 | Yamada |
| 5,911,113 | A | 6/1999 | Yao et al. |
| 5,913,140 | A | 6/1999 | Roche et al. |
| 5,920,792 | A | 7/1999 | Lin |
| 5,937,323 | A | 8/1999 | Qrezyk et al. |
| 5,953,635 | A | 9/1999 | Andideh |
| 5,962,923 | A | 10/1999 | Xu et al. |
| 5,963,840 | A | 10/1999 | Xia et al. |
| 5,968,610 | A | 10/1999 | Liu et al. |
| 5,972,192 | A | 10/1999 | Dubin et al. |
| 6,027,663 | A | 2/2000 | Martin et al. |
| 6,030,881 | A * | 2/2000 | Papasouliotis et al. ...... 438/424 |
| 6,077,451 | A | 6/2000 | Takenaka et al. |
| 6,077,574 | A | 6/2000 | Usami |
| 6,106,678 | A | 8/2000 | Shufflebotham et al. |
| 6,124,211 | A | 9/2000 | Butterbaugh et al. |
| 6,136,703 | A | 10/2000 | Vaartstra |
| 6,149,779 | A | 11/2000 | Van Cleemput |
| 6,184,158 | B1 | 2/2001 | Shufflebotham et al. |
| 6,200,412 | B1 | 3/2001 | Kilgore et al. |
| 6,211,065 | B1 | 4/2001 | Xi et al. |
| 6,232,196 | B1 | 5/2001 | Raaijmakers et al. |
| 6,265,269 | B1 | 7/2001 | Chen et al. |
| 6,277,764 | B1 | 8/2001 | Shin et al. |
| 6,331,494 | B1 | 12/2001 | Olson et al. |
| 6,335,261 | B1 * | 1/2002 | Natzle et al. ............... 438/435 |
| 6,395,150 | B1 | 5/2002 | Van Cleemput et al. |
| 6,400,023 | B2 | 6/2002 | Huang |
| 6,410,446 | B1 | 6/2002 | Tsai et al. |
| 6,451,705 | B1 * | 9/2002 | Trapp et al. ................. 438/723 |
| 6,479,361 | B1 | 11/2002 | Park |
| 6,479,396 | B1 | 11/2002 | Xu et al. |
| 6,486,081 | B1 | 11/2002 | Ishikawa et al. |
| 6,500,728 | B1 | 12/2002 | Wang |
| 6,531,377 | B2 | 3/2003 | Knorr et al. |
| 6,566,229 | B2 | 5/2003 | Hong et al. |
| 6,569,777 | B1 | 5/2003 | Hsu et al. |
| 6,596,653 | B2 | 7/2003 | Tan et al. |
| 6,596,654 | B1 | 7/2003 | Bayman et al. |
| 6,599,829 | B2 | 7/2003 | Smith et al. |
| 6,617,207 | B1 | 9/2003 | Kiryu et al. |
| 6,642,105 | B2 | 11/2003 | Kim et al. |
| 6,706,541 | B1 | 3/2004 | Toprac et al. |
| 6,737,334 | B2 | 5/2004 | Ho et al. |
| 6,787,483 | B1 | 9/2004 | Bayman et al. |
| 6,794,290 | B1 | 9/2004 | Papasouliotis et al. |
| 6,808,748 | B2 | 10/2004 | Kapoor et al. |
| 6,812,043 | B2 | 11/2004 | Bao et al. |
| 6,821,905 | B2 | 11/2004 | Pan et al. |
| 6,846,391 | B1 | 1/2005 | Papasouliotis et al. |
| 6,846,745 | B1 | 1/2005 | Papasouliotis et al. |
| 6,867,086 | B1 | 3/2005 | Chen et al. |
| 6,958,112 | B2 | 10/2005 | Karim et al. |
| 7,001,854 | B1 | 2/2006 | Papasouliotis et al. |
| 2001/0019903 | A1 | 9/2001 | Shufflebotham et al. |
| 2001/0044203 | A1 | 11/2001 | Huang et al. |
| 2002/0052119 | A1 | 5/2002 | Van Cleemput |
| 2002/0084257 | A1 | 7/2002 | Bjorkman et al. |
| 2002/0179570 | A1 | 12/2002 | Mathad et al. |
| 2003/0003244 | A1 * | 1/2003 | Rossman .................... 427/569 |
| 2003/0003682 | A1 * | 1/2003 | Moll et al. .................. 438/435 |
| 2003/0087506 | A1 | 5/2003 | Kirchhoff |
| 2003/0165632 | A1 * | 9/2003 | Lin et al. .................... 427/524 |
| 2003/0203652 | A1 | 10/2003 | Bao et al. |
| 2003/0207580 | A1 | 11/2003 | Li et al. |
| 2004/0020894 | A1 | 2/2004 | Williams et al. |
| 2004/0058549 | A1 | 3/2004 | Ho et al. |
| 2004/0082181 | A1 | 4/2004 | Doan et al. |
| 2004/0110390 | A1 | 6/2004 | Takagi et al. |
| 2004/0241342 | A1 | 12/2004 | Karim et al. |
| 2005/0074946 | A1 | 4/2005 | Chu et al. |
| 2005/0130411 | A1 | 6/2005 | Bao et al. |
| 2005/0250346 | A1 | 11/2005 | Schmitt |

OTHER PUBLICATIONS

Hook et al., "The Effects of Fluorine on Parametrics and Reliability in a 0.18-μm 3.5/6.8 nm Dual Gate Oxide CMOS Technology", IEEE Transactions on Electron Devices, vol. 48, No. 7., Jul. 2001, pp. 1346-1353.

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2004, from U.S. Appl. No. 10/271,333.

U.S. Office Action mailed Jun. 29, 2005, from U.S. Appl. No. 10/728,569.

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

Guari et al., "Method of Preventing Structures Erosion During Multi-Step Gap Fill", Novellus Systems, Inc., filed Dec. 4, 2003, U.S. Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

Bayman et al., "Gap Fill For High Aspect Ratio Structures", Novellus Systems, Inc., filed Jul. 13, 2004, U.S. Appl. No. 10/890,655, pp. 1-24.

U.S. Office Action mailed Jul. 25, 2005, from U.S. Appl. No. 10/890,655.

U.S. Office Action mailed Apr. 30, 2004, from U.S. Appl. No. 10/389,164.

Sutanto et al., "Method For Controlling Etch Process Repeatability", Novellus Systems, Inc., filed Sep. 2, 2003, U.S. Appl. No. 10/654,113, pp. 1-31.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Shanker et al., "Hydrogen Treatment Enhanced Gap Fill", Novellus Systems, Inc., filed Mar. 16, 2005, U.S. Appl. No. 11/082,369, pp. 1-33.

Papasoulitotis et al., "Deposition Profile Modification Through Process Chemistry", Novellus Systems, Inc., filed Dec. 9, 2002, U.S. Appl. No. 10/316,987, pp. 1-35.

U.S. Office Action mailed Jan. 27, 2005, from U.S. Appl. No. 10/316,987.

U.S. Office Action mailed Jul. 14, 2005, from U.S. Appl. No. 10/316,987.

Zhu et al., "Biased $H_2$ Etch Process In Deposition-Etch-Deposition Gap Fill", Novellus Systems, Inc., filed Dec. 10, 2003, U.S. Appl. No. 10/733,858, pp. 1-28.

U.S. Office Action mailed Apr. 19, 2005, from U.S. Appl. No. 10/733,85.

U.S. Office Action mailed Oct. 7, 2005, from U.S. Appl. No. 10/733,85.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

U.S. Office Action mailed Nov. 17, 2005, from U.S. Appl. No. 10/316,987.

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

Lang et al., "Using Water (H2O) To Replace Oxygen (O2) In A Silicon Dioxide (SiO2) Thin Film Deposition Process for HDP STI Technology", Novellus Systems, Inc., filed Nov. 9, 2005, U.S. Appl. No. 11/272,487, pp. 1-25.

U.S. Office Action mailed Jun. 1, 2006, from U.S. Appl. No. 10/728,569.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

U.S. Office Action mailed Feb. 16, 2006, from U.S. Appl. No. 11/082,369.

U.S. Office Action mailed Mar. 24, 2006, from U.S. Appl. No. 10/733,858.

* cited by examiner

DYNAMIC MODIFICATION OF GAP FILL PROCESS CHARACTERISTICS

BACKGROUND OF THE INVENTION

It is often necessary in semiconductor processing to fill a high aspect ratio gap with insulating material. As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap fill. The method deposits more material at the bottom of a high aspect ratio structure than on its sidewalls. HDP CVD is a line-of-sight process since it operates at a pressure regime, where the mean free path of the species is far longer than the characteristic dimension of the trenches and the thickness of the plasma sheath. Overhang at the entry region of the trenches is a generic feature of HDP CVD processes, associated with sputter etch reaction and redeposition of the material on the opposing facet, which will result in premature constriction, and formation of a void in the structure, if the process is not optimized. The redeposition probability increases as the distance between the two opposing facets decreases, hence the effects of redeposition become more prevalent as the critical dimension of the trenches decreases.

Evolving semiconductor device designs and dramatically reduced feature sizes have resulted in several applications where HDP processes are challenged in filling the high aspect ratio structures (AR>7:1) using existing technology. Historically, attempts to optimize the sputter:deposition (SD) ratio and the use of ambient gases which facilitate directional film growth in the trenches have been used too maximize the gap-fill capability of the HDP process. For structures at the 65 nm technology node, an active etch step, which removes material from the sidewall of the trenches, has been found to enable a void-free gap fill (see e.g., U.S. Pat. No. 6,030,881). A drawback of this process is that impurities (e.g., F, N and/or C from the chemical etchant used) are typically incorporated in the film. The problems associated with F doping are well known both for front-end and back-end applications (see, for example, T. B. Hook, et. al., IEEE Transactions on Electronic Devices, 48, 7, 1346–53, July 2001).

Accordingly, a gap fill process further optimized for high aspect ratio structures would be desirable.

SUMMARY OF THE INVENTION

This present invention addresses this need by providing a method for process optimization to extend the utility of the HDP CVD gap fill technique, for example in semiconductor device manufacture, to further reduced feature sizes. In a typical HDP process, the deposition and sputter components are maintained constant. The method of the present invention modifies the characteristics of the HDP process (deposition and sputter components) in a dynamic mode in the course of filling a trench with dielectric material. As a result, the amount of dielectric deposited on the sidewall of the trench relative to that deposited at its bottom can be reduced and optimally minimized, thus improving the gap fill capability of the process. The dynamic modification of process characteristics provides enhanced process performance, since the optimization of these characteristics depends upon structure geometry, which is constantly changing during a gap fill operation. In specific embodiments, it enables dielectric gap fill to the 65 nm technology node and beyond, without the use of an active etch step, thereby avoiding the contamination of the deposited film with etchant species sometimes associated with active etch. In semiconductor manufacture, the invention relates to HDP CVD processes used to deposit IMD, ILD, or STI films for gap fill applications.

In one aspect, the invention relates to a method of depositing a dielectric film on a semiconductor substrate. The method involves providing a substrate having a feature to be filled in a process chamber of a high density plasma chemical vapor deposition reactor and partially filling the feature on the substrate with a dielectric using a high density plasma chemical vapor deposition process having characteristics optimized to the initial feature geometry. During the course of the gap fill operation, either at one or more discrete points or continuously, the evolution of the feature geometry is determined, either by direct measurement or in accordance with a growth model, e.g., a stochastic simulation such as a Monte Carlo simulation. The deposition process is modified to optimize the characteristics to the partially-filled feature geometry, and further filling the partially-filled feature using the modified deposition process is conducted. The process modification, including the geometry determination, and further filling with optimized process characteristics is optionally repeated until the gap is filled.

These and other features and advantages of the present invention are described below.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

In a typical HDP gap fill process, the deposition and sputter components are maintained constant throughout the course of the operation. The method of the present invention modifies the characteristics of the HDP process (deposition and sputter components) in a dynamic mode in the course of filling a trench with dielectric material based on the evolving geometry of the gap. As a result, the amount of dielectric deposited on the sidewall of the trench relative to that deposited at its bottom can be reduced and optimally minimized, thus improving the gap fill capability of the process. The dynamic modification of process characteristics provides enhanced process performance, since the optimization of these characteristics depends upon structure geometry, which is constantly changing during a gap fill operation. In specific embodiments, it enables dielectric gap fill to the 65 nm technology node and beyond, without the use of an active etch step, thereby avoiding the contamination of the deposited film with etchant species sometimes associated with active etch. In semiconductor manufacture, the invention relates to HDP CVD processes used to deposit IMD, ILD, or STI films for gap fill applications.

The gap fill performance of a given HDP process is maximized when the amount of material deposited on the sidewall of the trench relative to that deposited at its bottom is minimum. The ratio depends both on the characteristics of the process and the geometry and dimensions of the structure. It is desirable, therefore, to tailor process characteristics relative to the geometry of the structure. Gap (e.g., trench) fill is an inherently transient process, with the geometry and dimensions of the structure constantly changing. Therefore, in accordance with the present invention, the characteristics of the process (deposition and sputter component) are changed dynamically relative to the geometry of the evolving structure in order to minimize the sidewall:trench bottom growth ratio and expand the process window for void-free gap fill.

Process Characteristics

Figure 1:
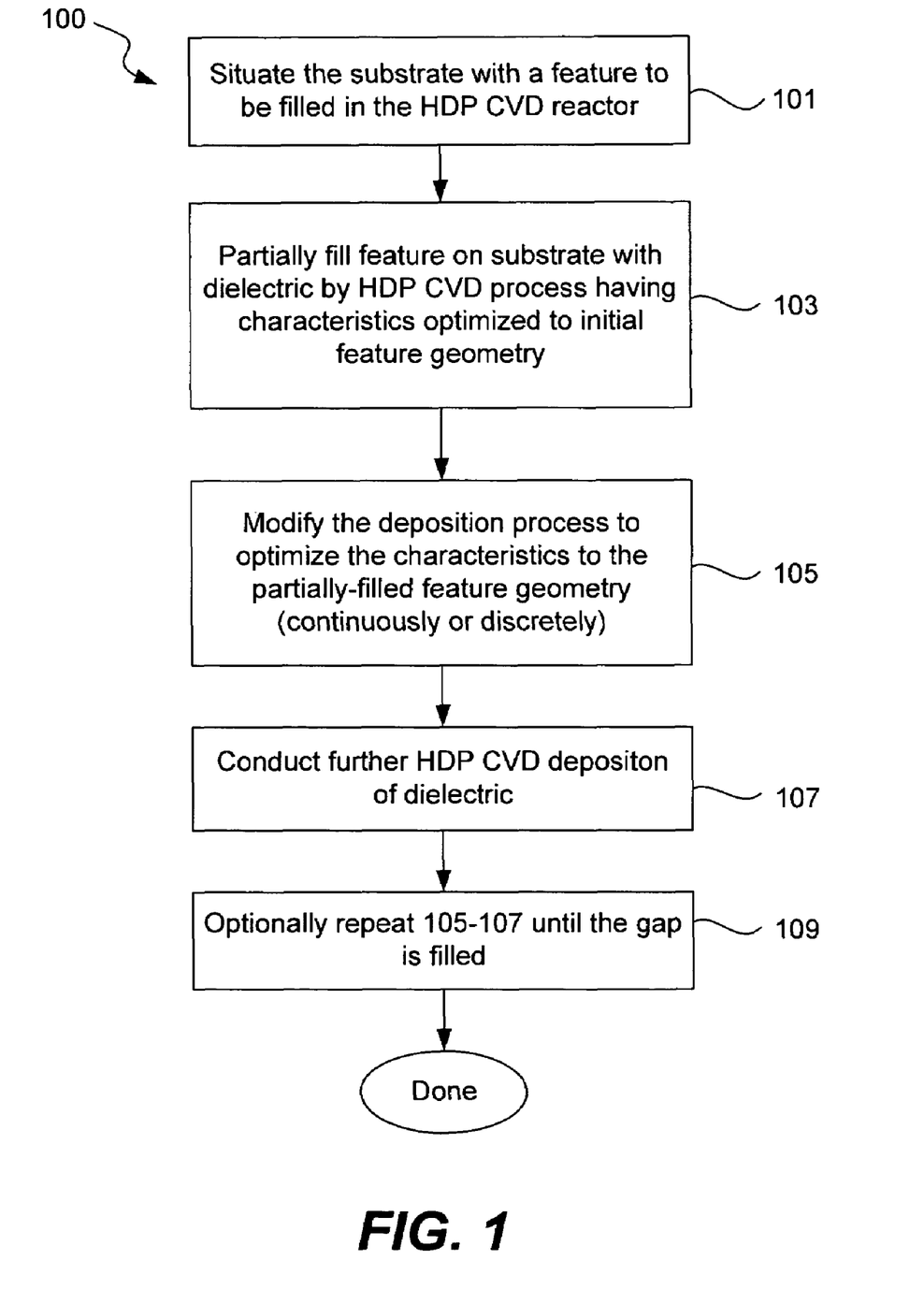
FIG. 1 shows a process flow for gap fill in accordance with the present invention.

FIG. 1 presents a process flow 100 showing key stages in a gap fill process in accordance with the present invention. The gap is filled with a dielectric deposited by a HDP CVD process. Generally, a high density plasma is any plasma having electron density of at least about $5 \times 10^9$ electrons per cubic centimeter. A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters.

A substrate having a feature (e.g., a gap or trench) to be filled is provided to a process chamber of a high density plasma chemical vapor deposition reactor (101). A typical substrate is a semiconductor wafer. Providing the substrate (e.g., wafer) to the reactor may involve clamping the substrate to a pedestal or other support in the chamber. For this purpose, an electrostatic or mechanical chuck may be employed.

Once situated, the feature is partially filled with a dielectric using a high density plasma chemical vapor deposition process having characteristics optimized to the initial feature geometry (103). The process adjusts the substrate temperature and pressure to a level promoting the deposition of the dielectric layer. Typically, this temperature is between about 30–1000° C. (more preferably about 300 to 680° C., for example 450–550° C.), and the pressure is below 100 mT. The temperature control mechanism preheats the wafer first to drive out certain interfering species. During deposition, the temperature may be maintained by supplying a heat transfer gas between a back surface of the substrate and a surface of the substrate holder on which the substrate is supported during the film growth operation. The initial process characteristics are determined by taking into account the both deposition and sputter rate and the feature geometry. Initially, when the feature structure is exposed, the sputter:deposition (SD) ratio is kept low, for example less than about 0.07, in order to allow some dielectric to build up on the feature structure, particularly the corners, which are otherwise susceptible to damage by the HDP sputter component. The initial feature geometry is determined, as described in further detail below, and taken onto account in setting the initial process characteristics.

The process gases used in accordance with the present invention will vary in composition, particularly in terms of their hydrogen composition as described above. Each additional component will be present at a particular level. Typically, the composition is represented by flow rates of the constituent gases in units of standard cubic centimeter per minute (sccm).

In all embodiments of this invention, elemental hydrogen is introduced into the chamber in at least one of the process gases. The process gas will also include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethyl-silane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for process gases of the present invention are listed below.

| Gas | Flow Rate (sccm) |
|---|---|
| $SiH_4$ | 10–250 |
| $O_2$ | 10–1000 |
| $H_2$ | 0–1500 |
| He | 0–500 |
| Ar | 0–100 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 125 sccm.

Note also that the presence of hydrogen in the process gas may require that the ratio of oxygen containing precursor to silicon-containing precursor be adjusted upward (in comparison to a standard hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 200 sccm, and more preferably at least about 400 sccm, and most preferably at least about 500 sccm—all based on a 200 millimeter substrate. Larger substrates require higher flow rates. The flow rate may vary somewhat when special injector configurations are employed.

The invention is also practiced with processes gases containing noble gas (e.g., argon, helium, or xenon), with helium being preferred, either as the sole carrier gas, or in a mixture with hydrogen. The use of noble gases can be practiced under the conditions of the above-described embodiments, and their flow rate can be used in order to modulate (i.e., dilute) the hydrogen-based deposition profile modification.

For doped dielectrics (particularly silicon dioxide based dielectrics), the process gas may include a dopant precursor such as a boron-containing gas, a phosphorus-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, $NO$, $N_2O$, and mixtures thereof.

The method applies as well to the deposition (biased or unbiased) of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethyl-silane), TMDSO (tetramethyl-disiloxane), TMDDSO (tetramethyl-diethoxyl-disiloxane), DMDMS (dimethyl-dimethoxyl-silane) and mixtures thereof).

Reactor pressure, which may vary during the course of the gap fill operation as the process characteristics are dynamically adjusted, is maintained within a range of values necessary to sustain the high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode (for generating the plasma) typically varies from 1 kW to 20 kW, and the high frequency power (for biasing the wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

Following an initial period of deposition, during which the feature is partially filled, the deposition process is modified to optimize the characteristics to the partially-filled feature geometry (105). As described further below, the partially-filled feature geometry may be determined by direct measurement or by a growth model, either at one or more discrete points or continuously. Once the process characteristics have been optimized to the new feature geometry, further filling of the partially-filled feature using the modified deposition process is conducted (107). Process modification (105) and further filling (107) may be optionally repeated, as necessary, until the feature is filled (109).

Determining Geometry

Figure 2A:
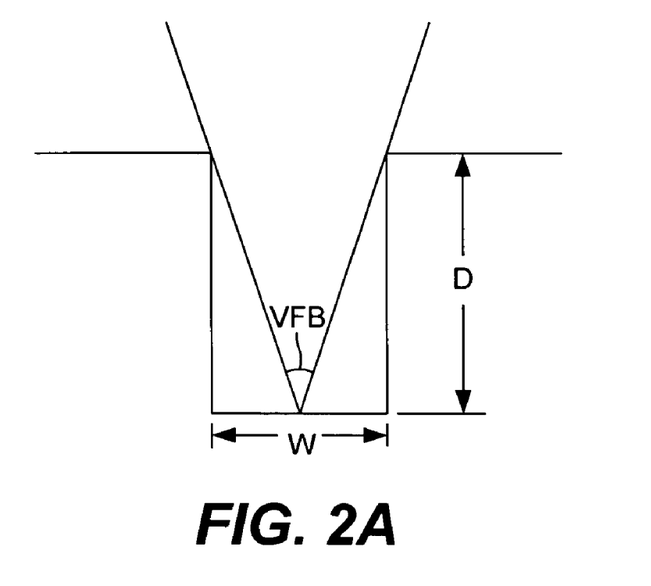
FIGS. 2A–B illustrate the elements used to calculate feature geometry in accordance with one embodiment of the present invention.
Figure 2B:
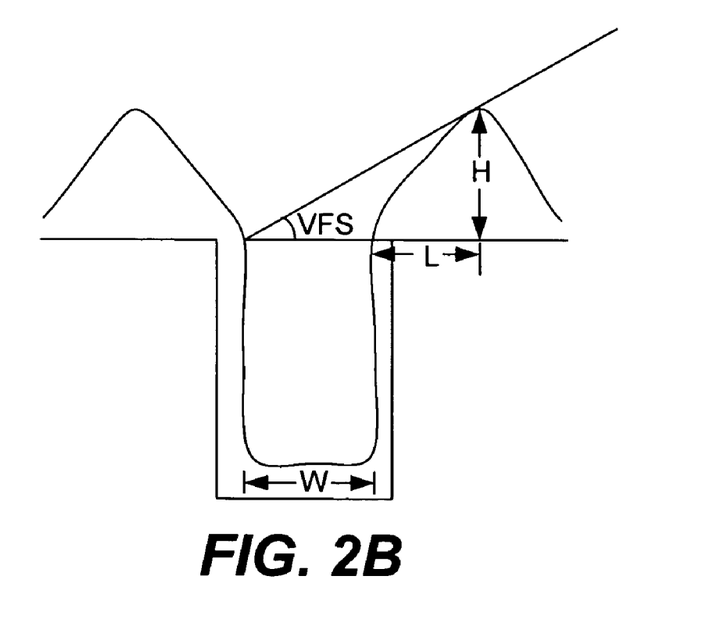

During the course of the gap fill operation, either at one or more discrete points or continuously, the evolution of the feature geometry is determined, either by direct measurement or in accordance with a growth model, e.g., a stochastic model such as a Monte Carlo simulation. Since HDP CVD is a line of sight process, the growth rate at the bottom of the trench should be directly proportional to the solid angle between that facet and the bulk of the plasma. Referring now to FIG. 2, the feature geometry is taken into account by the relationship of the solid angle between the bottom of the feature (VFB) and the bulk of the plasma, and the solid angle (VFS) between the sidewall and the opposing facet, including the HDP hat. These relationships may be represented by the following formulas, based on geometric calculations described by Keil, et. al. D. Keil, et. el., J. Electrochem. Soc, 148(7), G383 (2001) and Gottscho, et. al., R. A. Gottshco, et.

al., JVST B, 10(5), 2133 (1992), incorporated by reference herein for all purposes:

$$VFB = 2*\arctan(W/2D)$$

where W is the width of the trench and D its depth, and $$VFS = \arccos(1/SQRT[1+H^2/(W+L)^2])$$

where W is the width of the trench, H the height of the HDP hat and L is one half of the width of the line (the silicon column).

Thus, decreasing VFB corresponds to a structure either deeper or of smaller lateral dimension. Increasing VFS corresponds to a narrower trench or a higher HDP hat over the structure. The growth on the sidewall is driven by redeposition of material sputtered from the opposing facet. Hence, the growth rate should be proportional to the sputter rate of the material (which can be measured on a monitor wafer) multiplied by the solid angle VFS, which is proportional to the capture probability of a particle.

Figure 3A:
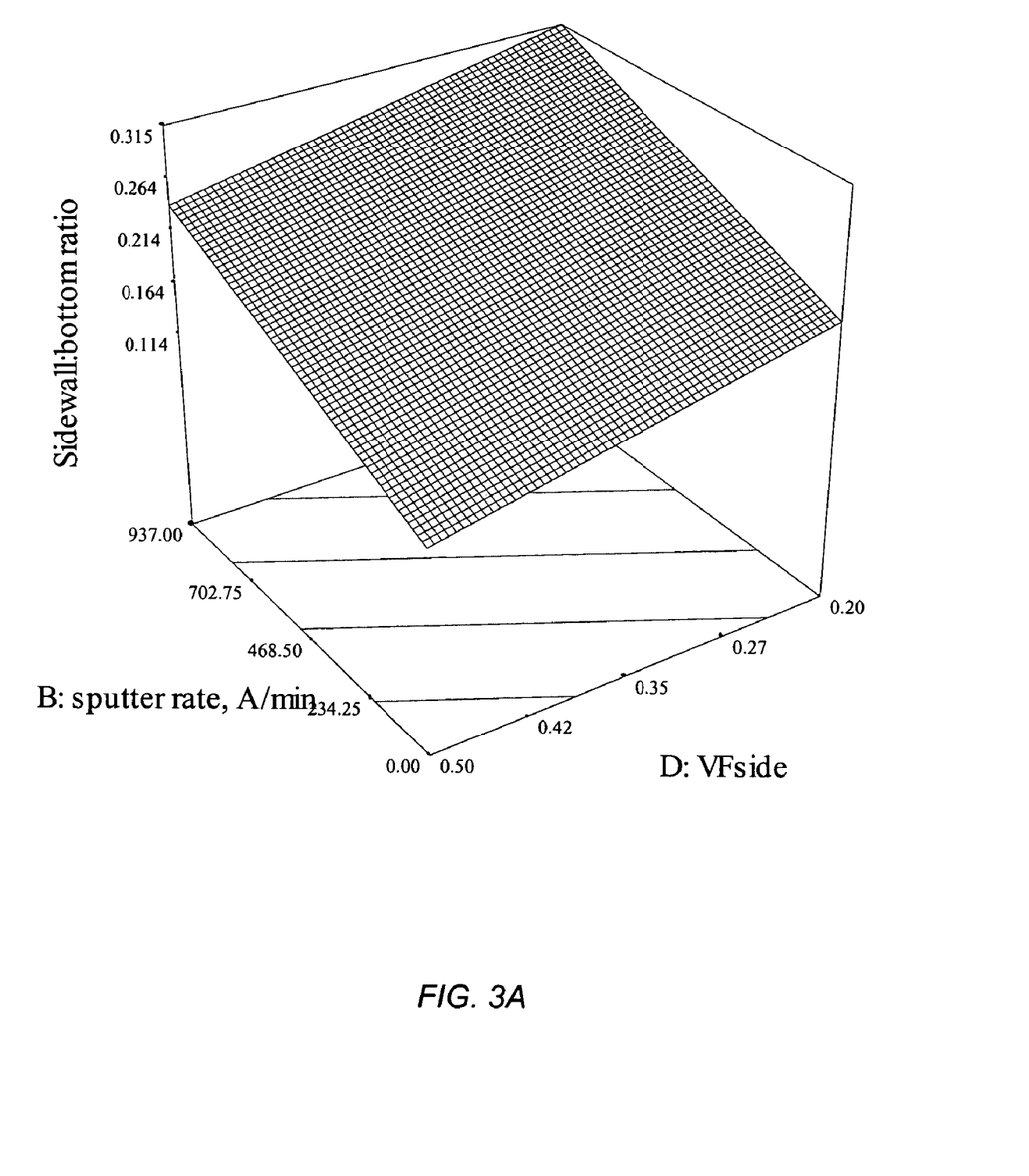
FIGS. 3A–B illustrate plots of sidewall:trench bottom growth ratio vs. sputter rate and structure geometry and film growth at the bottom of the trench vs. sputter rate and structure geometry, respectively, in accordance with one embodiment of the present invention.
Figure 3B:
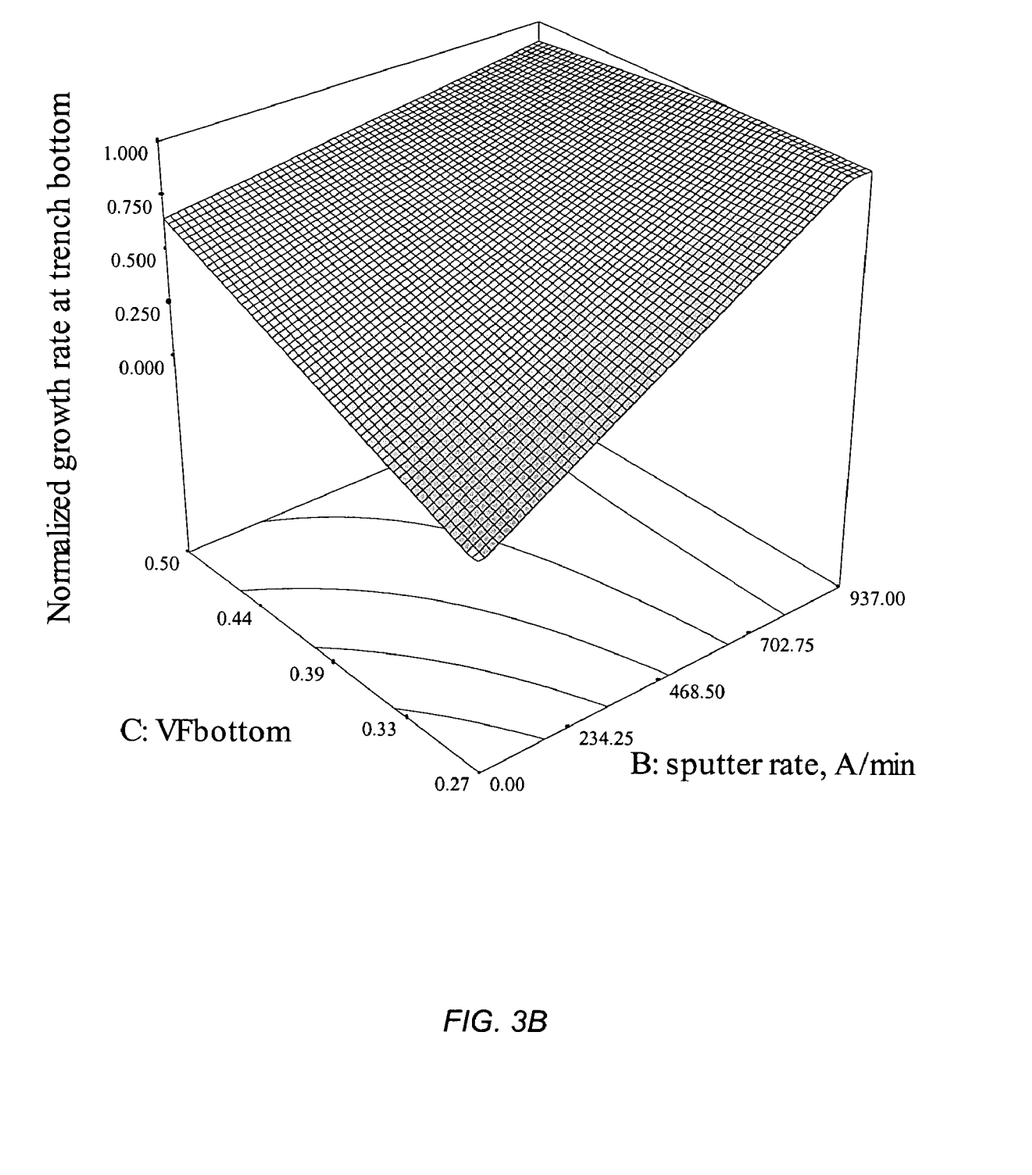

A design of experiment carried out using structures of controlled geometry can correlate the local growth rates at various locations in the trench to the characteristics of the process (deposition (DR) and sputter (SER) components) and the geometry of the structure to generate a model response. FIG. 3A shows the variation of sidewall growth with the sputter component (SER) for structures of ever decreasing dimensions (VFS decreasing). It is readily observed that overhang increases as SER increases and VFS decreases. Hence, as the trench fills, SER should be decreasing to maintain the sidewall:bottom ratio constant or, preferably, decreasing. On the other hand, FIG. 3B shows the variation of bottom growth with the sputter component (SER) for structures of ever decreasing dimensions (VFB decreasing). The amount of film at the bottom of the trench decreases with decreasing SER and VFB. This implies that the SER should be increasing as the trench fills with dielectric to maintain the growth at the bottom constant or, preferably, increasing. The combination of the two effects implies that for a given geometry there is an optimal point with respect to the characteristics of the process.

Accordingly, an optimal process will vary its deposition characteristics by determining the best balance between these sometimes countervailing effects for a particular feature geometry. Of course, this balance will change as the trench is filled and its geometry changes. Thus, a dynamic modification of gap fill process characteristics can achieve improved gap fill without the need for an active etch step.

Based on experimental observation, a set of rules, constituting a first order model, can be constructed for the evolution of the structure relative to process conditions. Standard optimization algorithms can be used to derive the optimal process sequence. The model for modulating process characteristics in order to derive an optimal trench fill outcome can be derived based on experimental observations regarding the evolution of structure profile as a function of deposition rate (i.e., plasma density and neutral concentration), sputter rate, SD ratio, and structure geometry. For example, the model may be based on a stochastic simulation, (e.g., a Monte Carlo simulation) such as are described in the following references: Junling Li, James p. McVittie, et. al., J. Vac. Sci. Technol. B, 13(4), 1867 July/August 1995; J. C. Arnold and H. H. Sawin, J. Appl. Phys., 70(10) 5 (1991); http://www.plasma-sputter.com/Calculation-ofFeature.htm; and Arvind Sankaran and Mark J. Kushner, "Fluorocarbon Plasma Etching and Profile Evolution of Porous Low-dielectric-constant Silica", Appl. Phys. Lett. 82, 1824 (2003).

The modification of process characteristics can be achieved by several methods, including gradually increasing (ramping) the HF power, or ramping both bias and source power settings. Process characteristics (e.g., deposition rate and sputter:deposition rate (SD) ratio) can also be modulated in a dynamic fashion by, for example, ramping up or down gas flows supplied to the reactor as indicted, for example, by the plots in FIGS. 3A–B. From the plots, it can be seen that there is a minimum in the sidewall to bottom ratio for a given geometry. The minimum is accomplished by setting the process parameters (SD ratio and deposition rate) as indicated by the plots. Thus, a model based on experimental data can be used to predict optimal process characteristics as function of structure geometry. Structure geometry, in turn, can be determined by stochastic simulation (e.g., Monte Carlo simulation). Alternatively, the evolution of feature geometry during the course of gap fill can be measured directly. For example, by measurements taken by SEM (scanning electron microscopy. This procedure is generally part of developing a process for the specific structure rather than part of the production run, since it requires stopping the process to take the measurements.

In one specific embodiment, the initial process characteristics are: deposition rate up to about 2 kA/min and SD ratio less than 0.12; and the modified process characteristics are: deposition rate up to about 5 kA/min and SD ratio less than 0.2.

HDP CVD Reactor

Various plasma reactor designs are suitable for use with this invention. The particular design is not critical to this invention. It merely needs to support HDP CVD dielectric layer formation on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors and described, for example, in U.S. Pat. Nos. 5,346,578, 5,405,480 and 5,605,599, the disclosures of which are incorporated by reference herein in their entirety and for all purposes.

Figure 4A:
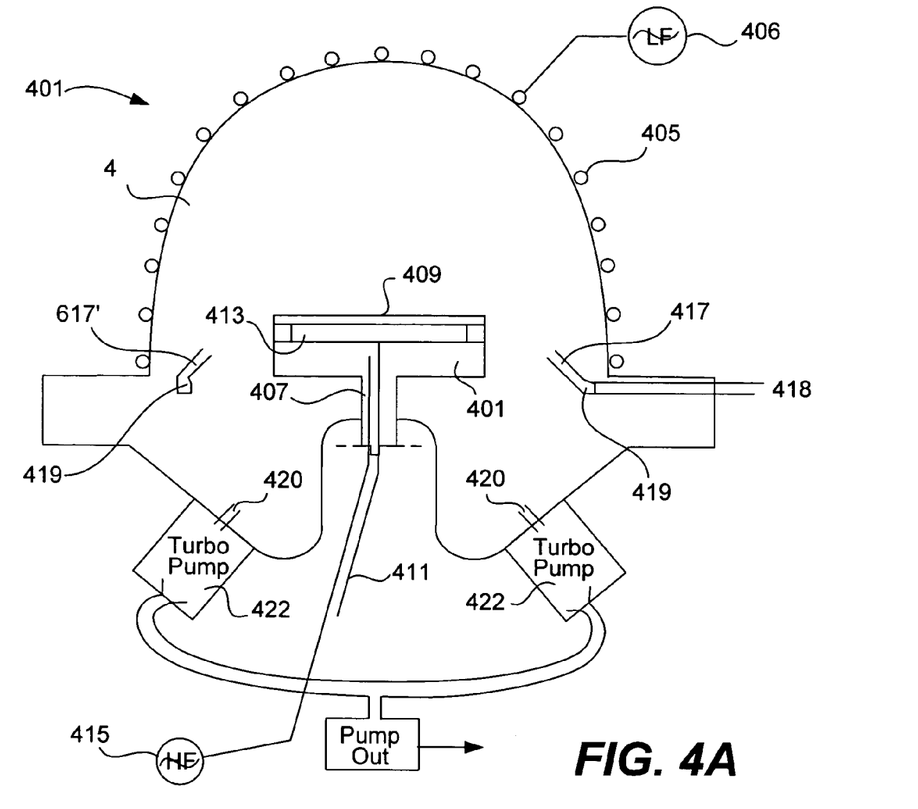
FIGS. 4A–B depict vertical and horizontal, respectively, cross-sectional block diagrams depicting some components of a suitable HDP CVD reactor suitable for conducting a gap fill process in accordance with the present invention on semiconductor wafers.

FIG. 4A is a vertical cross-section block diagram depicting some components of a suitable plasma processing reactor suitable for conducting a gap fill process in accordance with the present invention on semiconductor wafers. As shown, the reactor 401 includes a process chamber 403 which encloses other components of the reactor and serves to contain the plasma generated by the radio frequency power source coupled to the induction coil 405 which surrounds the chamber on or embedded in the chamber walls. In one example, the process chamber walls are made from aluminum, aluminum oxide, and/or other suitable material. The coil 405 is powered by a "low frequency" radio frequency (RF) source 406. The power and frequency supplied by source 406 is sufficient to generate high-density plasma from the process gas.

Within the reactor, a wafer pedestal 407 supports a substrate 409. The pedestal typically includes a chuck 408 to hold the substrate in place during the deposition reaction. The chuck may be an electrostatic chuck, a mechanical chuck or various other types of chuck as are available for use in the industry and/or research.

A heat transfer subsystem including a line 411 for supplying a heat transfer gas controls the temperature of substrate 409. In some embodiments, the heat transfer fluid comprises at least one of helium and argon gas. The heat transfer fluid is supplied to a space 413 between the surface of the substrate and a surface of the chuck.

A "high frequency" RF source 415 serves to electrically bias substrate 409 and draw charged precursor species onto the substrate for the deposition reactions. Electrical energy from source 415 is coupled to substrate 409 via an electrode or capacitive coupling, for example. Note that the bias applied to the substrate need not be an RF bias. Other frequencies and DC bias may be used as well. In a specific embodiment, source 415 supplies a radio frequency bias to the substrate with a power ranges from 0.5 kW to 10 kW.

Figure 4B:
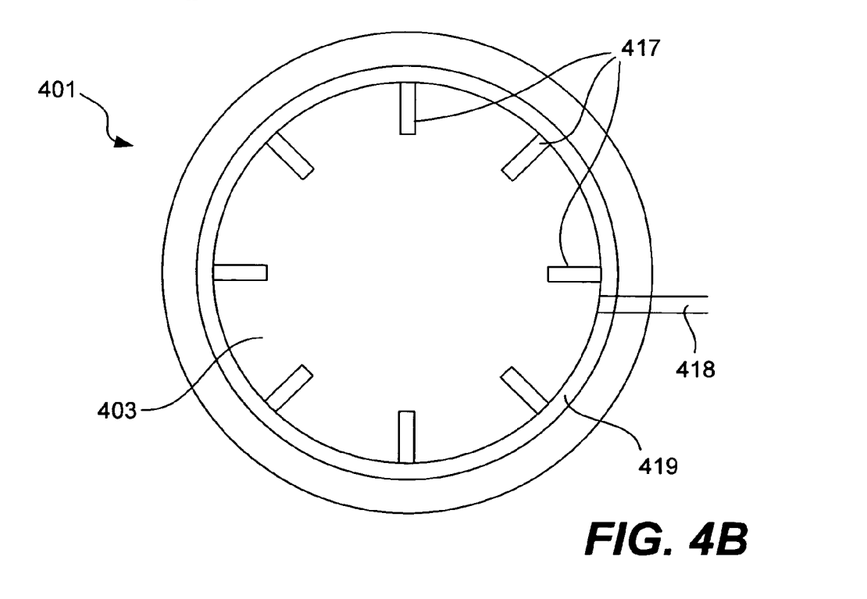

The process gases are introduced via one or more chamber inlets 417. The gases may be premixed or not. Other sources of dielectric precursor gases and carrier gases are also provided. Preferably, the process gas is introduced through a gas supply inlet mechanism including orifices. The gas or gas mixture may be introduced from a primary gas ring, which may or may not direct the gas toward the substrate surface. In this embodiment, a ring inlet(s) 418 is connected to the primary gas ring 419 to supply gas or gas mixture into the chamber via the chamber inlets 417. This arrangement is further illustrated in the horizontal cross-section of FIG. 4B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 403 via an outlet or outlets 420. A vacuum pump (e.g., a turbomolecular pump) or pumps 422 typically draws the gas out and maintains a suitably low pressure within the reactor.

As noted above, the gap fill process of the present invention is preferably accomplished in a single reactor process chamber, but it may also be accomplished in a plurality of processing chambers. When more than one processing chamber is used, a pressure controlled transfer module should be used to transfer the wafers from one chamber to another. Such transfer modules and procedures are known to those of skill in the art.

Substrates and Dielectric Materials

The above-described processes and apparatuses may deposit dielectric on any type of substrate that requires thin dielectric layers. Often, the substrate will be a semiconductor wafer. The invention is not, however, limited to such applications. It may be employed in a myriad of other fabrication processes such as for fabricating flat panel displays.

As indicated above, this invention finds particular value in integrated circuit fabrication. The dielectric deposition processes are performed on partially fabricated integrated circuits employing semiconductor substrates. In specific examples, the processes of this invention are employed in gap-filling for shallow trench isolation inter-layer dielectric trenches, etc.

EXAMPLES

The following examples are provided to further illustrate aspects and advantageous of the present invention. The invention is not limited by these examples.

Example 1

Performance of Dynamically Modified Process Vs. Process Operating at Constant Settings Using Direct Measurement Gap fill of a structure 500 Å wide by 3000 Å deep using a process operating at constant settings resulted in voids. The voids were eliminated by using a 2-step process to fill a feature of the same dimensions. The process characteristics were modified based on the changed feature geometry determined by direct measurement following the first deposition step. The first step had a deposition rate of 1000 Å/min and a SD ratio of 0.1. The second step had a deposition rate of 5500 Å/min and a SD ratio of 0.17. Uniform performance for both the center and edge of the wafer was demonstrated.

Example 2

Design of Experiment for Process Modification Based on Evolving Feature Geometry A design of experiment was carried out using structures of controlled geometry. The local growth rates at various locations in the trench were correlated to the characteristics of the process (DR, SER) and the geometry of the structure to generate a model response:

Normalized growth rate w/trench Bottom=0.61+0.031−DR+0.40−SER+0.17−VFB−0.16−VF side−0.27−SER−VF side+0.26−SER VF side−0.16−VFB−VF side Normalized side max rate=0.20−0.076−DR+0.037−SER−0.049−VFB−0.024−VF Side−+0.049−DR−VFB Sidewall max: Bottom Ratio=0.21−2.146 E−3.DR +0.063−SER−0.063−VFB−0.038 VF side +0.094 DR. VF side+0.056−VFB−FV Side DR=deposition rate on monitor wafer SER=sputter rate on monitor wafer The results, when plotted as shown if FIGS. 3A and B above, demonstrate that in order to keep the sidewall:bottom growth ratio (and gap-fill performance) constant as the trench fills, the sputter component of the process needs to be modulated.

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

All cited references are incorporated by reference herein in their entirety and for all purposes.

What is claimed is:

1. A method of depositing a dielectric film to fill a feature on a semiconductor substrate without using an active etch step, the method comprising:

(a) providing a substrate having a feature to be filled in a process chamber of a high density plasma chemical vapor deposition reactor;

(b) partially filling the feature on the substrate with a dielectric using a high density plasma chemical vapor deposition process having characteristics optimized to the initial feature geometry, the process characteristics comprising process gas flows and bias and source power settings;

(c) modifying the deposition process by at least increasing the bias power setting to optimize the characteristics to the partially-filled feature geometry; and (d) further filling the partially-filled feature using the modified deposition process;

wherein the method proceeds without an active etch step.

2. The method of claim 1, wherein the filling of the feature is complete following (d).

3. The method of claim 1, wherein (c) and (d) are repeated until the feature is filled.

4. The method of claim 1, wherein (c) further comprises determining the geometry of the partially filled feature to inform the process modification.

5. The method of claim 4, wherein the geometry determination comprises conducting a direct measurement of the feature geometry.

6. The method of claim 4, wherein the geometry determination is made using a growth model of the feature fill.

7. The method of claim 6, wherein the growth model is a stochastic simulation.

8. The method of claim 7, wherein the stochastic simulation is a Monte Carlo simulation.

9. The method of claim 1, wherein (c) occurs in one or more discrete periods during filling of the feature.

10. The method of claim 1, wherein (c) occurs continuously during filling of the feature.

11. The method of claim 1, wherein the SD ratio of the process is increased as the feature is filled.

12. The method of claim 1, wherein the initial process characteristics are: deposition rate up to about 2 kA/min and SD ratio less than 0.12.

13. The method of claim 12, wherein the modified process characteristics are: deposition rate up to about 5 kA/min and SD ratio less than 0.2.

14. The method of claim 1, wherein the process chamber is maintained at a pressure of not more than about 100 mTorr.

15. The method of claim 1, wherein the modifying of the deposition process in (c) further comprises increasing the source power setting.

16. The method of claim 1, wherein the modifying of the deposition process in (c) further comprises changing process gas flows supplied to the reactor.

17. The method of claim 1, wherein applying a bias to the substrate comprises supporting the substrate on a substrate holder having an electrode supplying a radio frequency bias to the substrate, the radio frequency bias being generated by supplying the electrode with at least 0.2 W/cm$^2$ of power.

18. The method of claim 17, wherein the radio frequency bias applied to the substrate is at the frequency range of between about 100 kHz and 27 MHz.

19. The method of claim 1, wherein the substrate is placed on placed on a substrate holder that is maintained at a temperature of between about 30 and 1000° C.

20. The method of claim 1, further comprising supplying a heat transfer gas between a surface of the substrate and a surface of the substrate holder on which the substrate is supported during the film growing.

21. The method of claim 1, further comprising clamping the substrate on an electrostatic or mechanical chuck during the film growing.

22. The method of claim 1, further comprising plasma phase reacting at least one of an oxygen-containing gas and a hydrogen-containing gas on the substrate surface and removing polymer residues from the substrate surface prior to the film growing.

23. The method of claim 1, wherein the dielectric film comprises a silicon oxide.

24. The method of claim 1, wherein the dielectric film comprises $SiO_2$.

25. The method of claim 1, wherein the gases include silicon and fluorine-containing reactants and the dielectric film comprises silicon oxyfluoride.

26. The method of claim 1, wherein the gases include nitrogen-containing reactants and the dielectric film comprises silicon oxynitride.

27. The method of claim 1, wherein the include phosphorus-containing reactants and the dielectric film comprises phosphorus-doped silicon oxide.

28. The method of claim 1, wherein the gases include boron-containing reactants and the dielectric film comprises boron-doped silicon oxide.

29. The method of claim 1, wherein the gases include boron-containing reactants and phosphorus-containing reactants and the dielectric film comprises phosphorus- and boron-doped silicon oxide (BPSG).

30. The method of claim 1, wherein the gases include organic reactants and the dielectric film comprises carbon-doped silicon oxide.

* * * * *